(12) United States Patent
Hwang et al.

(10) Patent No.: US 10,020,406 B2
(45) Date of Patent: Jul. 10, 2018

(54) PROTECTIVE FILM FOR SOLAR CELL AND SOLAR CELL COMPRISING THE SAME

(71) Applicant: LG CHEM, LTD., Seoul (KR)

(72) Inventors: Jang Yeon Hwang, Seoul (KR); Seung Lac Ma, Chungbuk (KR); Dong Ryul Kim, Daejeon (KR)

(73) Assignee: LG Chem, Ltd., Seoul (KR)

(*) Notice: Subject to any disclaimer, the term of this patent is extended or adjusted under 35 U.S.C. 154(b) by 0 days.

(21) Appl. No.: 14/081,453

(22) Filed: Nov. 15, 2013

(65) Prior Publication Data

US 2014/0069497 A1 Mar. 13, 2014

Related U.S. Application Data

(63) Continuation of application No. PCT/KR2012/003862, filed on May 16, 2012.

(30) Foreign Application Priority Data

May 16, 2011 (KR) .................. 10-2011-0045915
May 16, 2012 (KR) .................. 10-2012-0051958

(51) Int. Cl.
*H01L 31/0216* (2014.01)
*B32B 7/12* (2006.01)
(Continued)

(52) U.S. Cl.
CPC .......... *H01L 31/02167* (2013.01); *B32B 7/12* (2013.01); *B32B 27/18* (2013.01);
(Continued)

(58) Field of Classification Search
None
See application file for complete search history.

(56) References Cited

U.S. PATENT DOCUMENTS 6,335,479 B1 * 1/2002 Yamada et al. ............... 136/251
6,361,865 B1 * 3/2002 Tsuda et al. .................. 428/412
(Continued)

FOREIGN PATENT DOCUMENTS

JP 1996088385 A 4/1996
JP 2000-091610 A 3/2000
(Continued)

OTHER PUBLICATIONS

ChinaChemNet, Details for China Tinuvin 123, 1997-2011, ChinaChemNet Corp, retrieved May 1, 2015, http://www.chinachemnet.com/32177/Tinuvin-123-1396967.html.*
(Continued)

*Primary Examiner* — Callie Shosho
*Assistant Examiner* — Patrick English
(74) *Attorney, Agent, or Firm* — Dentons US LLP

(57) ABSTRACT

A protective film for a solar cell including a barrier film having a multilayer structure in which a substrate layer, an organic-inorganic hybrid layer and an inorganic barrier layer are sequentially stacked and a fluorine-based polymer layer, and a solar cell including the same are provided. Here, at least one of the substrate layer, the organic-inorganic hybrid layer, the inorganic barrier layer and the fluorine-based polymer layer includes at least one of a UV stabilizer and a UV absorbent. The protective film for a solar cell can prevent degradation of efficiency of a solar cell module due to oxygen and moisture penetration, and can prevent degradation of performance of the protective film caused by UV rays, and thus can significantly improve efficiency and lifespan of the solar cell module.

7 Claims, 6 Drawing Sheets

(51) Int. Cl.
  *B32B 27/18* (2006.01)
  *B32B 27/30* (2006.01)
  *B32B 27/32* (2006.01)
  *H01L 31/049* (2014.01)

(52) U.S. Cl.
  CPC .......... *B32B 27/304* (2013.01); *B32B 27/322* (2013.01); *H01L 31/049* (2014.12); *B32B 2255/28* (2013.01); *B32B 2307/71* (2013.01); *B32B 2457/00* (2013.01); *Y02E 10/50* (2013.01)

(56) References Cited

U.S. PATENT DOCUMENTS

| | | | |
|---|---|---|---|
| 2005/0175831 A1* | 8/2005 | Kim et al. | ............ 428/323 |
| 2010/0062246 A1 | 3/2010 | Kim et al. | |
| 2011/0083726 A1* | 4/2011 | Takayanagi | ........ H01L 31/048 136/251 |

FOREIGN PATENT DOCUMENTS

| | | |
|---|---|---|
| JP | 2000-091611 A | 3/2000 |
| JP | 2000174298 A | 6/2000 |
| JP | 2004083846 A | 3/2004 |
| JP | 2004-214641 A | 7/2004 |
| JP | 2006137821 A | 6/2006 |
| JP | 2007-523769 A | 8/2007 |
| KR | 1020090006197 A | 1/2009 |
| KR | 1020090034883 A | 4/2009 |
| KR | 102010089038 A | 8/2010 |
| KR | 1020100135087 A | 12/2010 |
| WO | 2007-063698 A1 | 6/2007 |
| WO | WO 2009095275 A1 * | 8/2009 ............ B32B 27/08 |
| WO | 2010/058988 A2 | 5/2010 |
| WO | WO 2011062932 A1 * | 5/2011 |
| WO | 2011/028513 A2 | 10/2011 |

OTHER PUBLICATIONS

ChemicalBook, 147315-50-2, CAS Database, retrieved May 1, 2015, pp. 1-2, http://www.chemicalbook.com/CASEN_147315-50-2.htm.*

Ciba Specialty Chemicals, Ciba Tinuvin 326, Jun. 2002, Ciba Specialty Chemicals, Inc, retrieved May 1, 2015, pp. 1-2, http://www.shanghaiguanan.com/pic/2014916154624916.pdf.*

* cited by examiner ant. # PROTECTIVE FILM FOR SOLAR CELL AND SOLAR CELL COMPRISING THE SAME This application is a Continuation Bypass Application of International Patent Application No. PCT/KR2012/003862, filed May 16, 2012, and claims the benefit of Korean Patent Application No. 10-2011-0045915 filed on May 16, 2011, and Korean Patent Application No. 10-2012-0051958 filed on May 16, 2012, in the Korean Intellectual Property Office, the disclosures of which are incorporated herein by reference.

BACKGROUND

1. Field of the Invention

The present invention relates to a protective film for a solar cell that can prevent degradation of efficiency of a solar cell module due to oxygen and moisture penetration, can prevent degradation of performance of the protective film caused by UV rays, and thus can significantly improve efficiency and lifespan of the solar cell module, and a solar cell including the same.

2. Discussion of Related Art

Recently, solar photovoltaic power generation using solar cells has attracted attention as a next-generation energy industry. Particularly, since the energy source is clean and does not generate carbon dioxide generated when coal or petroleum is used, it can help to prevent global warming and is useful as an eco-friendly alternative energy source.

Generally, a solar cell is manufactured from a semiconductor material exhibiting the photoelectric effect, whereby electron emission is induced by incident light. When light is incident on the semiconductor material, negatively charged electrons and positively charged holes are generated, and the electrons move to a negative electrode and the holes move to a positive electrode because of a difference in potentials or concentration of charges. The solar cell is a diode generating electric power using the electrons and the holes that are concentrated on the negative and positive electrodes, respectively.

Recently, solar cells are usually manufactured by suitably combining monocrystalline silicon, polycrystalline silicon, and amorphous silicon thin films, so that thinner and more efficient solar cells can be developed and produced.

Solar cells are mounted externally, specifically, on outer walls or roofs of buildings directly exposed to sunlight, to maximize efficiency. As a protective film for protecting a solar cell module when the solar cells are exposed to an external environment for a long time, a glass substrate having various advantages such as a low coefficient of linear expansion, an excellent gas barrier property, a high degree of light penetration, a high surface planarity, and excellent thermal and chemical resistances is conventionally used.

However, the glass substrate is easily broken due to a low shock resistance, and is heavy due to a high density. For these reasons, research aimed at replacing the glass substrate with a plastic substrate is progressing.

When the glass substrate used as the protective film for a solar cell is replaced with the plastic substrate, a total weight of the solar cell module may be reduced and flexibility in design of the solar cell module may be provided. Moreover, compared with the glass substrate, the plastic substrate is strong against shock and may be economical when manufactured in a continuous process.

Meanwhile, as the protective film for a solar cell, the plastic substrate needs to have oxygen and vapor barrier properties to prevent aging of the solar cell module, UV stability, a low coefficient of linear expansion and dimensional stability to prevent distortion of the substrate according to change in the processing temperature, a high mechanical strength that is compatible with a processing apparatus used for the conventional glass substrate, a chemical resistance capable of tolerating an etching process, a high degree of light transmittance and a low double refractive index, and surface scratch resistance, but especially, oxygen and moisture barrier properties and UV stability.

However, since there is no high-functional polymer substrate film (including polymer films and polymer-inorganic material composite films) satisfying these requirements, attempts have been made to provide the above-mentioned physical properties by performing multi-layered functional coating on the polymer substrate film.

SUMMARY OF THE INVENTION

The present invention is directed to providing a protective film for a solar cell that can prevent degradation of efficiency of a solar cell module due to oxygen and moisture penetration, can prevent degradation of performance of the protective film caused by UV rays, and thus may significantly improve efficiency and lifespan of the solar cell module, and a solar cell including the same.

One aspect of the present invention provides a protective film for a solar cell including a barrier film and a fluorine-based polymer layer, and a solar cell including the same. The barrier film has a structure in which a substrate layer, and an organic-inorganic hybrid layer and an inorganic barrier layer, which are presented on one or both surfaces of the substrate layer, are sequentially stacked. Here, at least one of the substrate layer, the organic-inorganic hybrid layer, the inorganic barrier layer and the fluorine-based polymer layer includes at least one of an ultraviolet ray stabilizer and an ultraviolet ray absorbent.

DETAILED DESCRIPTION OF EXEMPLARY EMBODIMENTS

Figure 1:
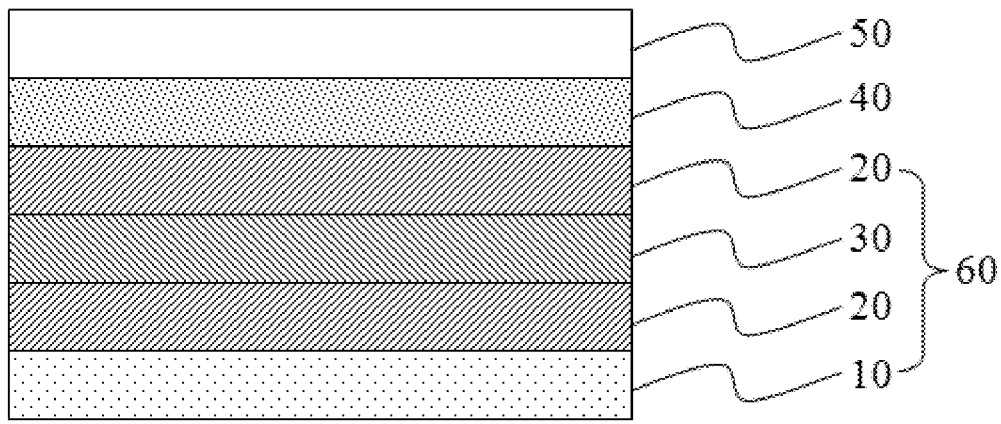
FIGS. 1 to 3 show examples of a protective film for a solar cell according to the present invention, respectively.

The present invention provides a protective film for a solar cell, including a barrier film and a fluorine-based polymer layer. The barrier film has a structure in which a substrate layer and at least one of an organic-inorganic hybrid layer and an inorganic barrier layer, which is presented on one or both surface of the substrate layer, are stacked. At least one of the substrate layer, organic-inorganic hybrid layer, inorganic barrier layer and fluorine-based polymer layer may include at least one of an ultraviolet (UV) ray stabilizer and an ultraviolet (UV) ray absorbent. Since it includes the inorganic barrier layer, the protective film for a solar cell is able to prevent degradation of efficiency of a solar cell module due to oxygen and moisture permeation. In addition, since it uses the UV-resistant fluorine-based polymer layer, the protective film for a solar cell is able to prevent degradation of performance of the protective film due to UV rays, thereby significantly improving the efficiency and lifespan of the solar cell module.

The barrier film may include a symmetrical structure formed on both surfaces of the substrate layer by sequentially stacking an organic-inorganic hybrid layer, an inorganic barrier layer and an organic-inorganic hybrid layer. When the inorganic barrier layer is stacked on a top surface of the organic-inorganic hybrid layer, the inorganic barrier layer may be stacked on a planarized surface, and a gas barrier property may be further improved due to an excellent adhesive strength between the inorganic barrier layer and the organic-inorganic hybrid layer. In addition, when the organic-inorganic hybrid layer is further stacked on the top surface of the inorganic barrier layer, the inorganic barrier layer may be protected from external physical contact, and defects of the inorganic barrier layer may be compensated for, thereby further improving the gas barrier property. Moreover, due to a high modulus of the inorganic barrier layer and a low coefficient of linear expansion, mechanical properties of the entire barrier film may be also improved.

The protective film for a solar cell may include a pressure-sensitive adhesive layer formed between a barrier film and a fluorine-based polymer layer. The pressure-sensitive adhesive layer may be used to attach the barrier film having the multi-layered structure to the fluorine-based polymer film, and specifically, the pressure-sensitive adhesive layer may be, but is not limited to, at least one of ethylene vinyl acetate (EVA), polyvinyl butiral (PVB) and polybenzimidazole.

The pressure-sensitive adhesive layer which has been formed in a film type using a coating solution prepared by dissolving composition for forming a pressure-sensitive adhesive in a solvent may be stacked on a separate substrate layer. In some cases, the pressure-sensitive adhesive layer may be directly coated on the substrate layer of the barrier film without a separate substrate layer.

The coating method may be, but is not limited to, 2-roll reverse coating, 3-roll reverse coating, flow coating, gravure coating, micro gravure coating, dye coating, curtain coating, bar coating or dip coating.

In addition, the pressure-sensitive adhesive layer may further include at least one of the UV stabilizer and UV absorbent.

The substrate layer may include at least one of a homopolymer, a blend of at least two polymers and a polymer composite material containing an organic or inorganic additive. A polymer forming the substrate layer may be at least one of polynorbornene, aromatic fluorene polyester, polyethersulfone, bisphenol-A polysulfone, polyimide, polyethyleneterephthalate, polyethylenenaphthalene, polyacrylate, polycarbonate and a cyclic olefin copolymer.

In addition, the substrate layer may have a structure in which nano materials are dispersed in the polymer. Such a polymer composite may be a polymer-clay nanocomposite, in which physical properties of the polymer such as a mechanical property, a thermal resistance, a gas barrier property and dimensional stability may be improved with a small amount of the clay, compared with a conventionally used composite such as glass fiber, due to a small particle size (<1 micron) and a high aspect ratio of the clay. That is, in order to improve the physical properties, it is important to peel a clay layer formed in a lamella structure and to uniformly disperse the clay layer in a polymer matrix, and a material satisfying these conditions is the polymer-clay composite.

The polymer and clay which may be used in the polymer-clay composite are not specifically limited. In one exemplary embodiment, the polymer may include at least one of polystyrene, polymethacrylate, polyethyleneterephthalate, polyethylenenaphthalene, polyarylate, polycarbonate, a cyclic olefin copolymer, polynorbornene, aromatic fluorene polyester, polyethersulfone, polyimide, an epoxy resin and a multifunctional acrylate. The clay may include at least one of laponite, montmorillonite, saphonite, hectorite, beydillite, bentonite, nontronite, vermiculite, illite, muscovite, mica and fluorinated mica.

The substrate layer may be formed in a film or sheet type to have a thickness of, but not specifically limited to, 10 to 2000 μm, 50 to 1500 μm, or 100 to 1000 μm. The substrate layer may be manufactured by solution casting or a film extrusion process, and is preferably annealed shortly for several seconds to minutes at approximately a glass transition temperature to minimize deformation according to a temperature after manufacture of the substrate layer. After annealing, to improve coatability and an adhesive property, a surface of the plastic film may be treated by primer coating, plasma treatment using corona, argon, oxygen, nitrogen or carbon dioxide, UV-ozone treatment, or ion beam treatment using inflow of a reactive gas.

The barrier film may include a substrate layer, an organic-inorganic hybrid layer and an inorganic barrier layer. Here, the barrier film may be used without particular limitation as long as it can block oxygen or moisture from flowing in from an external environment. In addition, in some cases, the barrier film may be manufactured from a composition further properly including a filler, a solvent and a polymerization catalyst.

In one embodiment, the organic-inorganic hybrid layer may be a partial hydrolysate of a composition including organic silane and metal alkoxide.

In addition, in some cases, the organic-inorganic hybrid layer may be manufactured of a composition further properly including a filler, a solvent and a polymerization catalyst.

The organic silane may be at least one selected from compounds represented by Formulas a to c, and here, when one organic silane compound is used, it is preferably cross-linkable.

  [Formula a]

$(R^9)_m\text{—Si—}X_{(4-m)}$

  [Formula b]

$(R^9)_m\text{—O—Si—}X_{(4-m)}$

  [Formula c]

$(R^9)_m\text{—HR}^{10}\text{—Si—}X_{(4-m)}$

In Formulas a to c, $R^9$ is an alkyl having 1 to 12 carbon atoms, an alkenyl, alkynyl, aryl, arylalkyl, alkylaryl, arylalkenyl, alkenylaryl, arylalkynyl, alkynylaryl, halogen, amino, amide, aldehyde, ketone, alkylcarbonyl, carboxy, mercapto, cyano, hydroxyl, alkoxy having 1 to 12 carbon atoms, alkoxycarbonyl having 1 to 12 carbon atoms, sulfonic acid, phosphoric acid, aryloxy, methacryloxy, epoxy or vinyl group, $R^{10}$ is hydrogen or alkyl having 1 to 12 carbon atoms, X is hydrogen, halogen, alkoxy having 1 to 12 carbon atoms, acyloxy, alkylcarbonyl, alkoxycarbonyl or —N($R^{11}$)$_2$, $R^{11}$ is hydrogen or alkyl having 1 to 12 carbon atoms, and m is an integer of 1 to 3.

Examples of the organic silane may include methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylethoxysilane, dimethylethoxysilane, diphenylmethoxysilane, diphenylethoxysilane, 3-aminopropyltriethoxysilane, 3-glycidoxypropyltrimethoxysilane, p-aminophenylsilane, allyltrimethoxysilane, n-(2-aminoethyl)-3-aminopropyltrimethoxysilane, 3-aminepropyltriethoxysilane, 3-aminopropyltrimethoxysilane, 3-glycidoxypropyldiisopropyl ethoxysilane, (3-glycidoxypropyl)methyldiethoxysilane, 3-glycidoxypropyltrimethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, and vinyltrimethoxysilane.

The metal alkoxide may be at least one selected from compounds represented by Formula d.

$$M\text{-}(R^{12})_z \qquad \text{[Formula d]}$$

In Formula d, M is at least one of aluminum, zirconium and titanium, $R^{12}$ is halogen, alkyl having 1 to 12 carbon atoms, alkoxy, acyloxy or hydroxyl group, and z is an integer of 3 or 4.

In the organic-inorganic hybrid layer, a content of the organic silane may be 20 to 99.99 parts by weight, 50 to 99 parts by weight, or 70 to 99 parts by weight based on 100 parts by weight of the composition for manufacturing the organic-inorganic hybrid layer. In addition, a content of the metal alkoxide may be 0.01 to 80 parts by weight, 0.01 to 70 parts by weight, or 20 to 70 parts by weight based on 100 parts by weight of a composition for manufacturing the organic-inorganic hybrid layer.

Amounts of the filler, solvent and catalyst added to the organic-inorganic hybrid layer may vary as needed, and thus are not specifically limited. The filler may be at least one material selected from metal, glass powder, diamond powder, silicon oxide, clay, calcium phosphate, magnesium phosphate, barium sulfate, aluminum fluoride, calcium silicate, magnesium silicate, barium silicate, barium carbonate, barium hydroxide and aluminum silicate. The solvent may be one conventionally used in partial hydrolysis, for example, distilled water. In addition, the catalyst is also specifically limited, and may be aluminum butoixde and/or zirconium propoxide.

The inorganic barrier layer may include at least one inorganic material selected from $SiO_x$ (here, x is an integer of 1 to 3), $SiO_xN_y$ (here, x and y are each an integer of 1 to 3), $Al_2O_3$, $TiO_2$, $SnO_2$ and ITO.

The inorganic barrier layer included in the barrier film may be formed by deposition coating a transparent inorganic material having a high density or a metal thin film having a nanometer-sized thickness on a top surface of the organic-inorganic hybrid layer using a physical or chemical method. The deposition coating method may be sputtering, chemical deposition, ion plating, atomic layer deposition, plasma chemical deposition or a sol-gel method. The inorganic barrier layer formed by the above-mentioned method may have a thickness of 5 to 1000 nm, 5 to 500 nm, 20 to 500 nm, or 50 to 200 nm.

The inorganic barrier layer may further include a filler, a solvent or a catalyst, when necessary. An amount of the filler, solvent or catalyst used herein may vary as needed, and thus is not specifically limited.

In one embodiment, the filler may be at least one material selected from metal, glass powder, diamond powder, silicon oxide, clay, calcium phosphate, magnesium phosphate, barium sulfate, aluminum fluoride, calcium silicate, magnesium silicate, barium silicate, barium carbonate, barium hydroxide and aluminum silicate.

The solvent may be one conventionally used in partial hydrolysis, for example, distilled water. In addition, the catalyst may also be, but is not limited to, aluminum butoixde and/or zirconium propoxide.

The barrier film according to the present invention has a multi-layered structure formed in various types.

In one embodiment, the barrier film includes a substrate layer formed in two layers, and may have a structure in which an organic-inorganic hybrid layer and an inorganic barrier layer are stacked on top and bottom surfaces of the substrate layer formed in two layers. Specifically, the barrier film may include a substrate layer formed in two layers, and have a symmetrical structure in which an organic-inorganic hybrid layer and an inorganic barrier layer are sequentially stacked on one surface of each the substrate layer, and surfaces of each the substrate layer on which the organic-inorganic hybrid layer and the inorganic barrier layer are not formed are joined together. The symmetric barrier film prevents twisting of the substrate layer in one direction due to a temperature change. In addition, the barrier film having the symmetrical structure may have high productivity by using a simple process of laminating the substrate layers together. Also, the barrier film having a low coefficient of linear expansion, excellent dimensional stability, a gas barrier property and excellent surface hardness may be manufactured using inexpensive equipment.

The fluorine-based polymer layer may include a fluorine-containing copolymer, and the fluorine-containing copolymer may be a copolymer of a monomer containing a fluorine atom and a monomer containing a hydroxyl or epoxy group.

The fluorine-based compound used to manufacture the fluorine-based polymer layer may include a fluorine-containing copolymer. The fluorine-containing copolymer may be obtained by copolymerizing a monomer containing a fluorine atom and a monomer containing a hydroxyl or epoxy group, and obtained by adding an ethylenically unsaturated monomer as needed, but the present invention is not limited thereto.

The monomer containing the fluorine atom may include one or some combination of two or more of tetrafluoroethylene, hexafluoropropylene, vinylidene fluoride, chlorotrifluoroethylene, trifluoroethylene, tetrafluoroethylene, alkylvinylether fluoride, alkoxyalkylvinylether fluoride, perfluoro(alkylvinylether), perfluoro(alkoxyvinylether) and fluorine-containing methacrylic acid ester.

The monomer containing the hydroxyl or epoxy group may include one or some combination of two or more of hydroxyethylvinylether, hydroxypropylvinylether, hydroxybutylvinylether, hydroxypentylvinylether, hydroxyhexylvinylether, hydroxyethylarylether, hydroxybutylarylether, glycerolmonoallylether, allylalcohol and hydroxyethyl methacrylic acid ester.

A content of the fluorine-containing compound may be 0.5 to 10 parts by weight, or 0.5 to 5 parts by weight based on 100 weight of the composition for forming the fluorine-based polymer layer.

The fluorine-based polymer layer may be manufactured in a film type after the fluorine-based compound is dissolved in a solvent to prepare a fluorine coating solution, and then stacked on a pressure-sensitive adhesive layer.

In the fluorine coating solution, the solvent may be, but is not limited to, perfluorocarbons such as perfluoropentane, perfluorohexane, and perfluorooctane; perfluoropolyethers such as methyl nonafluoroisobutyl ether, and methyl non-afluorobutyl ether; hydrochlorofluorocarbons such as 1-chloro-1,2,2-trifluorocyclobutane, 1-chloro-2,3,4-trifluorobenzne, chlorofluorobenzene, and dichlorofluorobenzene, which may be used alone or in combination.

In one embodiment according to the present invention, the protective film for a solar cell may include at least one of a UV stabilizer and a UV absorbent. For example, at least one of the UV stabilizer and the UV absorbent may be included in at least one layer of a substrate layer, an organic-inorganic hybrid layer and an inorganic barrier layer, which may constitute a barrier film. In addition, at least one of the UV stabilizer and the UV absorbent may be included in a pressure-sensitive adhesive layer or a fluorine-based polymer layer in the protective film for a solar cell. In some cases, a separate coating layer may be further formed on one or both surfaces of the barrier film, and the coating layer may have a structure including at least one of the UV stabilizer and the UV absorbent.

The UV stabilizer may have a maximum absorption peak within a range of 340 to 430 nm, 340 to 400 nm, or 360 to 400 nm. When the maximum absorption peak of the UV stabilizer is in the above-mentioned wavelength range, degradation in UV absorbability may be prevented and a high visible light transmittance and excellent color expression may be realized.

The UV stabilizer may further include a radical scavenger (HALS) compound.

The radical scavenger may include a compound having a structure of Formula 1.

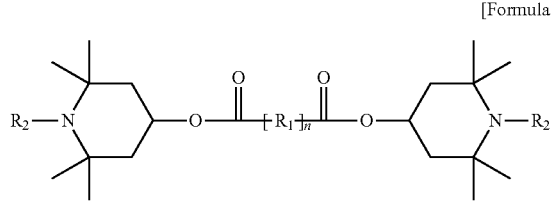

[Formula 1]

In Formula 1, $R_1$ is $CH_2$, n is 1 to 16, and $R_2$ is hydrogen; an alkyl group having 1 to 16 carbon atoms that is unsubstituted or substituted with halogen, a cyano or nitro group; an aryl group having 6 to 20 carbon atoms that is unsubstituted or substituted with halogen, a cyano or nitro group; an alkoxy group having 1 to 16 carbon atoms that is unsubstituted or substituted with halogen, a cyano or nitro group; or an aryloxy group having 6 to 20 carbon atoms that is unsubstituted or substituted with halogen, a cyano or nitro group.

When used alone, the radical scavenger represented by Formula 1 has function insignificantly as a UV stabilizer since it usually has UV absorbability at 340 nm or less, but UV stabilization effect is increased when used in combination with the UV absorbent.

The UV absorbent functions to stabilize electron energy excited by UV absorption by converting the electron energy into heat energy, and terminate a free radical. Besides, the UV absorbent may be used in combination with the radical scavenger that functions to remove a radical, stop photooxidation, and decompose a peroxide.

The UV absorbent may include a compound having a structure according to Formula 3.

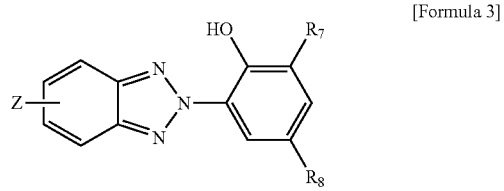

[Formula 3]

In Formula 3, Z is hydrogen or a chlorine substituent, $R_7$ and $R_8$ are independently hydrogen; halogen; an alkyl group having 1 to 16 carbon atoms that is unsubstituted or substituted with halogen, a cyano or nitro group; an aryl group having 6 to 20 carbon atoms that is unsubstituted or substituted with halogen, a cyano or nitro group; an alkoxy group having 1 to 16 carbon atoms that is unsubstituted or substituted with halogen, a cyano or nitro group; or an aryloxy group having 6 to 20 carbon atoms that is unsubstituted or substituted with halogen, a cyano or nitro group.

The UV absorbent may also include a compound having a structure of Formula 2-a.

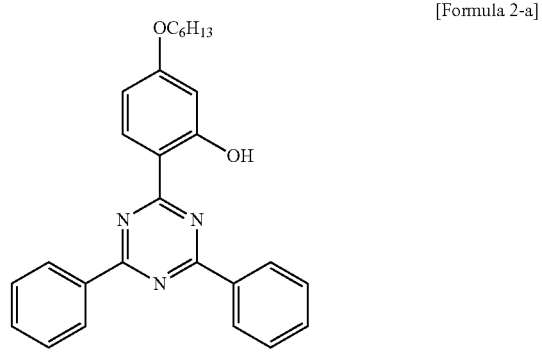

[Formula 2-a]

For example, the compound of Formula 3 may have a structure of Formula 3-a or 3-b.

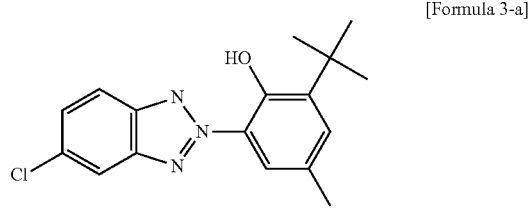

[Formula 3-a]

[Formula 3-b]

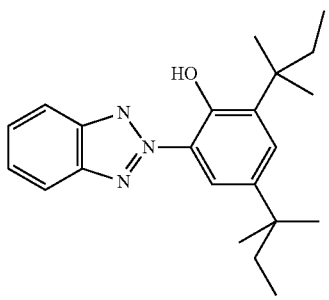

In one example, as a UV stabilizer, LA 67 (produced by Adeka) may be used. In addition, as a UV absorbent, Tinuvin 1577 (2-(4,6-Diphenyl-1,3,5-triazin-2-yl)-5-[(hexyl)oxy]-phenol), Tinuvin 326 (2-2-hydroxy-3'-t-butyl-5'-methylphenyl)-5-chlorobenzotriazole) or Tinuvin 328 (2-(3,5-di-t-amyl-2-hydroxyphenyl)benzotriazole), which is produced by Ciba-Geigy, may be used alone or in combination. In addition to these, various commercially available UV stabilizers and absorbents may be used.

A content of the UV absorbent or stabilizer may be 0.01 to 50 parts by weight based on 100 parts by weight of each film to which the UV absorbent and/or stabilizer are/is added. In the above content range, a significant effect may be exhibited due to addition of the UV absorbent and/or stabilizer, and influencing to optical characteristics incurred from absorption occurring in the visible light range may be prevented. For example, when an excessive amount of the UV absorbent and/or stabilizer is added to the pressure-sensitive adhesive layer, the UV absorbent and/or stabilizer may have an influence on physical properties of the pressure-sensitive adhesive.

A method of laminating layers constituting the protective film may be performed using a pressure-sensitive adhesive having the same composition as the pressure-sensitive adhesive layer described above, or by a thermal laminating method, but the present invention is not limited thereto. When the pressure-sensitive adhesive is used, its content is not specifically limited, but a thickness of the pressure-sensitive adhesive layer formed above may be 0.1 to 75 µm, 0.5 to 50 µm, 0.1 to 30 µm, or 0.5 to 30 µm.

In addition, the present invention provides a solar cell including the protective film for a solar cell.

The solar cell according to the present invention may have a structure in which a gap between cells of the solar cell, which are disposed in series or parallel, is filled with a filler composed of a thermosetting plastic (an ethylene vinyl acetate copolymer), the protective film for a solar cell according to the present invention is disposed on a surface where sunlight is incident, and the other surface of the solar cell is protected with a back sheet, but the present invention is not limited thereto.

Hereinafter, the present invention will be described with reference to the drawings in further detail. The drawings are merely provided to describe the present invention in detail, not to limit the scope of the present invention.

Figure 2:
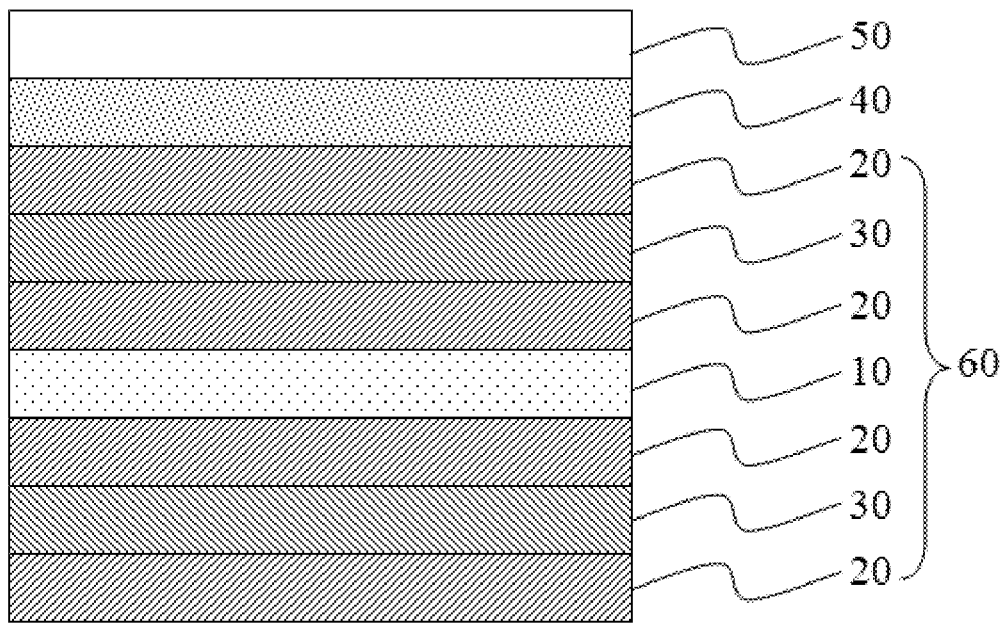
Figure 3:
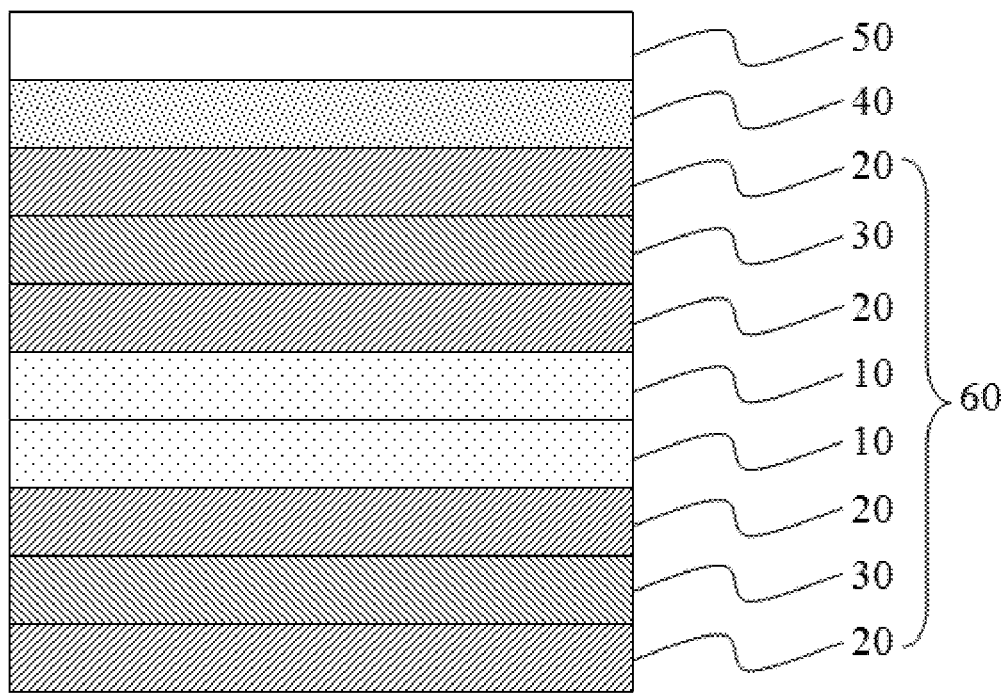

FIGS. 1 to 3 are schematic diagrams showing a stacked structure of a protective film for a solar cell according to an exemplary embodiment of the present invention, respectively.

Referring to FIG. 1, a protective film for a solar cell 100 includes a multi-layered barrier film 60, a pressure-sensitive adhesive layer 40 and a fluorine-based polymer layer 50. In addition, the barrier film 60 has a structure in which a substrate layer 10, an organic-inorganic hybrid layer 20, an inorganic barrier layer 30 and an organic-inorganic hybrid layer 20 are sequentially stacked.

A protective film for a solar cell 200 shown in FIG. 2 has a barrier film 60 formed therein to have a symmetrical structure. Specifically, an organic-inorganic hybrid layer 20, an inorganic barrier layer 30 and an organic-inorganic hybrid layer 20 are sequentially stacked on both surfaces of the substrate layer 10 to form a symmetrical structure.

A protective film for a solar cell 300 shown in FIG. 3 has a barrier film 60 formed therein to have a symmetrical structure. Specifically, a structure having two substrate layers 10 included in the barrier film 60 is formed. That is, the structure is manufactured by sequentially stacking an organic-inorganic hybrid layer 20, an inorganic barrier layer 30 and an organic-inorganic hybrid layer on one surface of one substrate layer 10, sequentially stacking an organic-inorganic hybrid layer 20, an inorganic barrier layer 30 and an organic-inorganic hybrid layer on one surface of the other substrate layer 10, and laminating both substrate layers 10 together. Here, the two substrate layers 10 are laminated to have a symmetrical structure about the substrate layer by attaching surfaces of the substrate layers on which the organic-inorganic hybrid layer and the inorganic barrier layer are not formed. A separate pressure-sensitive adhesive layer (not shown) may be interposed between the two substrate layers 10.

Hereinafter, the present invention will be described in further detail with reference to Examples. Examples of the present invention are merely provided to describe the present invention in detail, not to limit the scope of the present invention.

Example 1

A protective film for a solar cell including a barrier film, a pressure-sensitive adhesive layer and a fluorine-based polymer layer was manufactured.

Specifically, the barrier film was manufactured to have a structure in which an organic-inorganic hybrid layer, an inorganic barrier layer and an organic-inorganic hybrid layer are sequentially stacked on a top surface of a substrate layer. Specifically, the barrier film was manufactured using the substrate layer using a polyester (PET) film having a thickness of 50 µm; an organic-inorganic hybrid layer using a partial hydrolysate of a composition including organic silane of Formula e and metal alkoxide of Formula f; and an inorganic barrier layer including $SiO_2$.

$(R^9)_2$—Si—$X_2$ [Formula e]

In Formula e, $R^9$ is an alkyl group having 6 carbon atoms, X is an alkoxy group having 6 carbon atoms, and m is an integer of 1 to 3.

Al—$(R^{12})_3$ [Formula f]

In Formula f, $R^{12}$ is an alkyl group having 6 carbon atoms.

The protective film was manufactured by stacking a pressure-sensitive adhesive layer including ethylene vinyl acetate (EVA) on the barrier film, and adhering a fluorine-based polymer layer including a copolymer of a tetrafluoroethylene monomer and hydroxyethylvinylether to the pressure-sensitive adhesive layer.

Figure 4A:
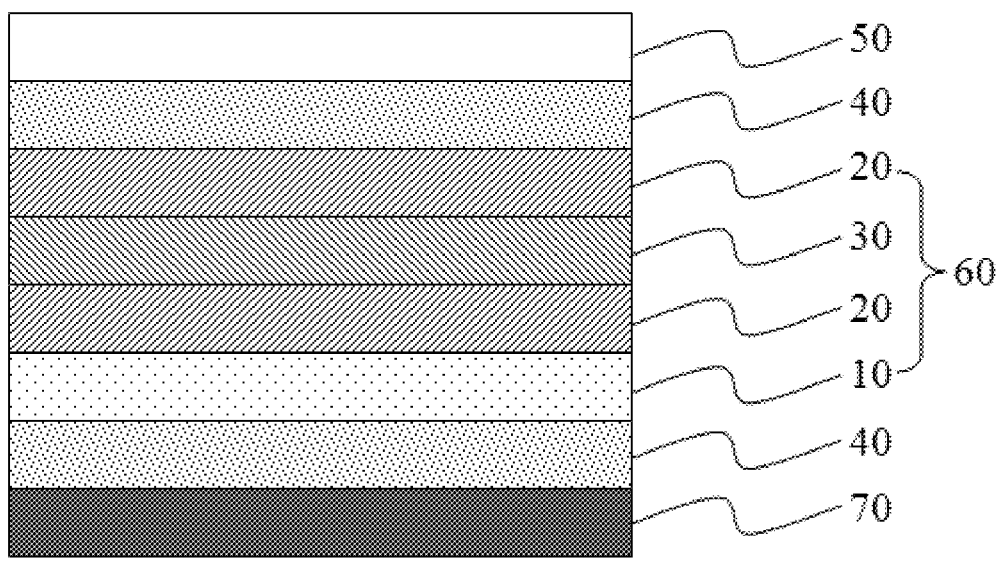
FIG. 4A shows a structure of a protective film for a solar cell according to Example 1.

In addition, a module in which the solar cell diodes (70) are attached shown in FIG. 4a was designed by stacking a pressure-sensitive adhesive layer including ethylene vinyl acetate on a lower surface of the protective film previously manufactured.

Example 2

A protective film for a solar cell including a barrier film, a pressure-sensitive adhesive layer and a fluorine-based polymer layer was manufactured.

Specifically, the barrier film was manufactured to have a structure in which an organic-inorganic hybrid layer, an inorganic barrier layer and an organic-inorganic hybrid layer are sequentially stacked on a bottom surface of a substrate layer. Specifically, the barrier film was manufactured using polyester (PET) film having a thickness of 50 μm as a substrate layer; an organic-inorganic hybrid layer using a partial hydrolysate of a composition including organic silane of Formula e and metal alkoxide of Formula f; and an inorganic barrier layer including $SiO_2$.

The protective film was manufactured by stacking a pressure-sensitive adhesive layer including ethylene vinyl acetate (EVA) on the barrier film, and adhering a fluorine-based polymer layer including a copolymer of a tetrafluoroethylene monomer and hydroxyethylvinylether to the pressure-sensitive adhesive layer.

Figure 4B:
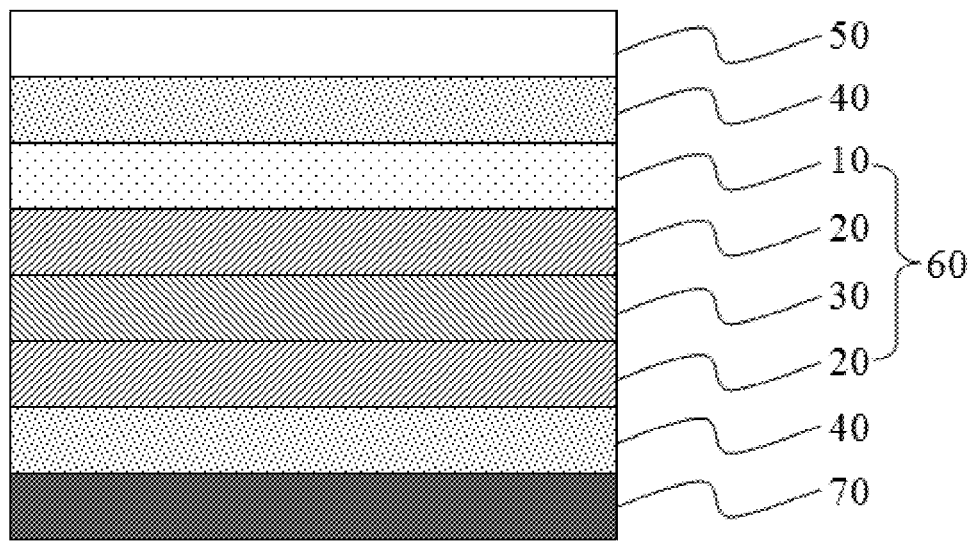
FIG. 4B shows a structure of a protective film for a solar cell according to Example 2.

In addition, a module in which solar cell diodes (70) are attached shown in FIG. 4b was designed by stacking a pressure-sensitive adhesive layer including ethylene vinyl acetate on a lower surface of the protective film previously manufactured.

Experimental Example 1: Evaluation of Water Resistance and Adhesion of the Protective Film for a Solar Cell Solar cell diodes to which the protective films manufactured in Examples 1 and 2 were attached, respectively, were placed in contact with water at 120° C. for 96 hours. Afterward, adhesion between the solar cell diode and the protective film was observed.

As a result, inter-layer delamination in the protective film was not observed. Therefore, it was confirmed that the protective film for a solar cell according to the present invention had excellent water resistance and adhesion.

Figure 5:
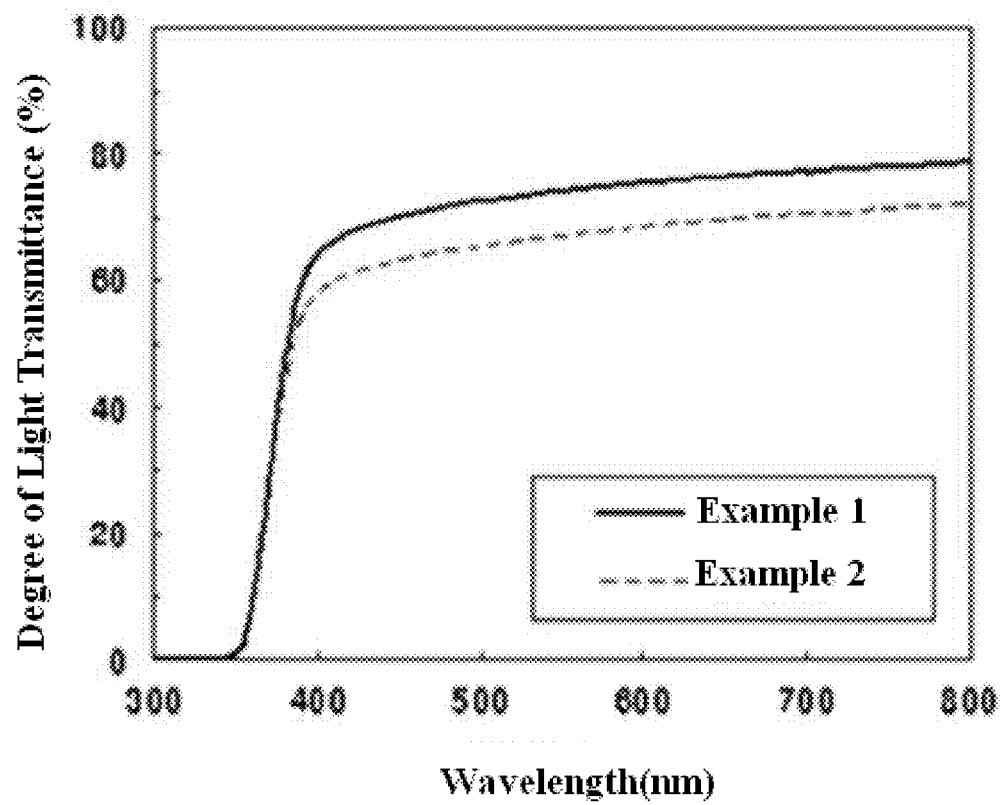
FIG. 5 is a graph showing results of a degree of light transmittance with respect to the protective films for a solar cell according to Examples 1 and 2 of the present invention.

Experimental Example 2: Evaluation of Degree of Light Transmittance of the Protective Film for a Solar Cell After the solar cell diodes to which the protective films manufactured in Examples 1 and 2 were attached were treated in water at 120° C. for 96 hours, only the protective films were delaminated, and then their light transmittance characteristics were measured using a UV3600 spectrophotometer produced by Shimadzu. The results are shown in FIG. 5. Referring to FIG. 5, the protective films of Examples 1 and 2 exhibited high degrees of light transmittance (60% or more) in a wavelength range of 450 to 800 nm.

Experimental Example 3: Evaluation of Light Resistance of Fluorine-Based Polymer Layer The light resistance of a polyester film and a fluorine-based polymer layer were evaluated and compared. A tetrafluoroethylene-hexafluoropropylene copolymer (a fluorinated ethylene propylene (FEP) copolymer) film was used as the fluorine-based polymer layer.

Each film had a thickness of 50 μm, and experiments were performed for two cases: with UV treatment and without UV treatment. UV treatment was performed by quick UV treatment (QUV) with respect to the film at 0.6 W/m² and 60° C. for 100 hours, and light transmittance was measured using a UV3600 spectrophotometer produced by Shimadzu. The measured light transmittance results are shown in FIG. 6.

TABLE 1

| No. | Kind | UV Treatment |
|---|---|---|
| (a) | Fluorine-based polymer layer | X |
| (b) | Fluorine-based polymer layer | ○ |
| (c) | Polyester film | X |
| (d) | Polyester film | ○ |

Figure 6:
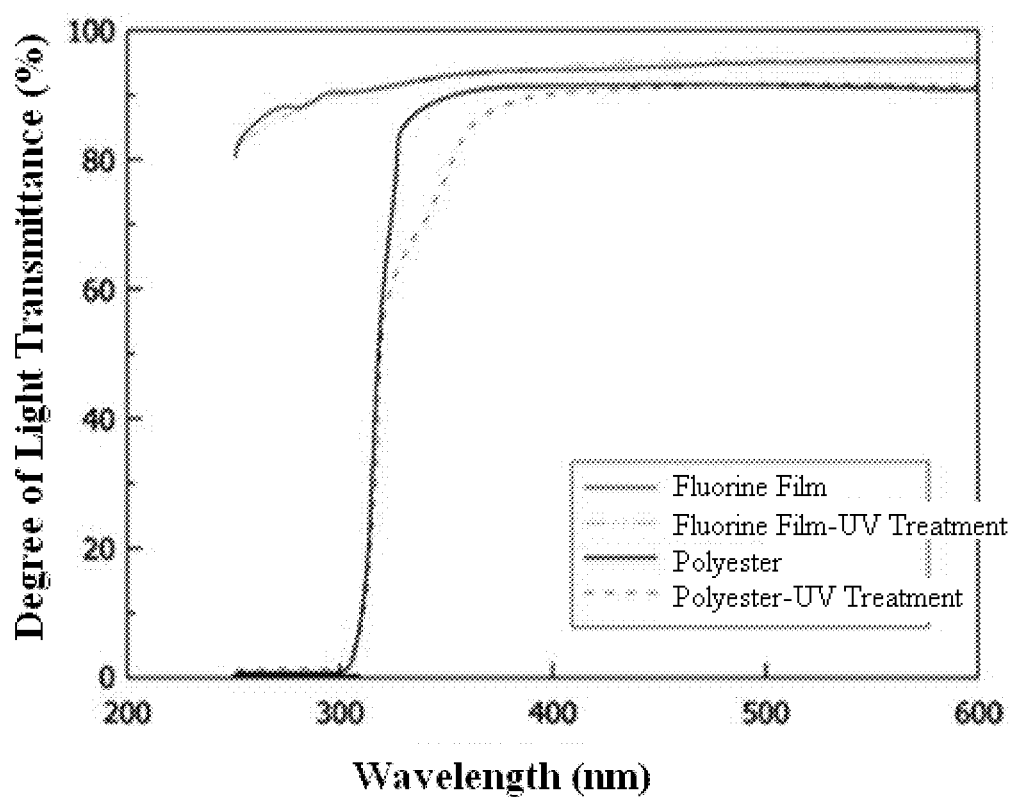
FIG. 6 is a graph showing results obtained by comparing light transmittance according to UV treatment to a polyester film and a fluorine-based polymer layer.

Referring to FIG. 6, when exposed to UV rays, the FEP copolymer used as the fluorine-based polymer layer did not exhibit any change in light transmittance across a full range of wavelengths. However, it could be seen that the PET film did exhibit a decrease in degree of light transmittance in the UV 'A' wavelength range, that is, from 320 to 400 nm. In addition, it could be seen that the light transmittance of the fluorine-based polymer layer was relatively good across the full range of wavelengths.

Accordingly, it was determined that the efficiency of the protective film according to the present invention is not degraded by UV rays and it has excellent durability.

Example 3: Manufacture of Protective Film Including Coating Layer to which UV Absorbent is Added A protective film for a solar cell was manufactured by the same method as described in Example 1, except that Tinuvin 1577, Tinuvin 326 and Tinuvin 328 were mixed together in a weight ratio of 1:1:1 and added to an organic silane compound included in an organic-inorganic hybrid layer. A total content of the added UV absorbent was varied to 0.0, 1.2, 2.4, 4.8 and 12.0 parts by weight.

Figure 7:
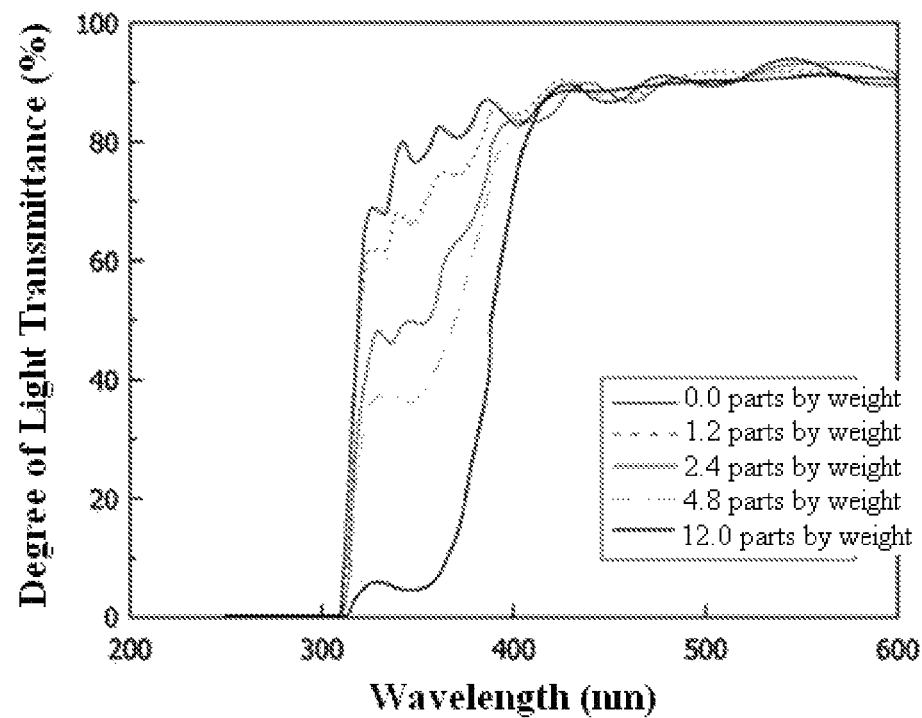
FIG. 7 is a graph showing a degree of light transmittance according to a content of a UV absorbent with respect to an organic-inorganic hybrid layer having the structure of Example 1.

A light transmittance of each film previously manufactured was measured using an UV3600 spectrophotometer produced by Shimadzu, and the measurement results are shown in FIG. 7.

Referring to FIG. 7, the degree of light transmittance of the barrier film containing a UV absorbent decreased in the UV 'A' wavelength range, for example, from 320 to 400 nm, compared with the degree of light transmittance of the barrier film not containing a UV absorbent. Accordingly, it was confirmed that a barrier film for protecting a solar cell that is stable in the UV 'A' wavelength band, that is, from 320 to 400 nm, can be manufactured by adding the UV absorbent.

Examples 4 and 5: Manufacture of Protective Film Containing Pressure-Sensitive Adhesive Layer to which UV Absorbent is Added A protective film for a solar cell was manufactured to have the same structure as in Example 1, by the same method as described in Example 1, except that a pressure-sensitive adhesive layer was manufactured to have a composition described in Table 2.

TABLE 2

| pressure-sensitive adhesive composition | Example 4 (parts by weight) | Example 5 (parts by weight) |
|---|---|---|
| Pressure-sensitive adhesive | 6BB | 100.0 |

TABLE 2-continued

| pressure-sensitive adhesive composition | | Example 4 (parts by weight) | Example 5 (parts by weight) |
|---|---|---|---|
| UV stabilizer | LA 67 | | 0.30 |
| UV absorbent | Tinuvin 1577 | 1.0 | 1.0 |
| | Tinuvin 326 | 3.0 | 5.0 |
| | Tinuvin 328 | 3.0 | 5.0 |
| | Total | 7.0 | 11.0 |

Experimental Example 4: Measurement of Light Resistance of Barrier Film

After protective films manufactured by the same methods as described in Examples 4 and 5 were subjected to UV treatment at an intensity of 0.6 W/m² and a temperature of 60° C. for 100 hours, a degree of light transmittance for each film was measured using a UV3600 spectrophotometer produced by Shimadzu. The measurement results are shown in FIG. 8.

Figure 8:
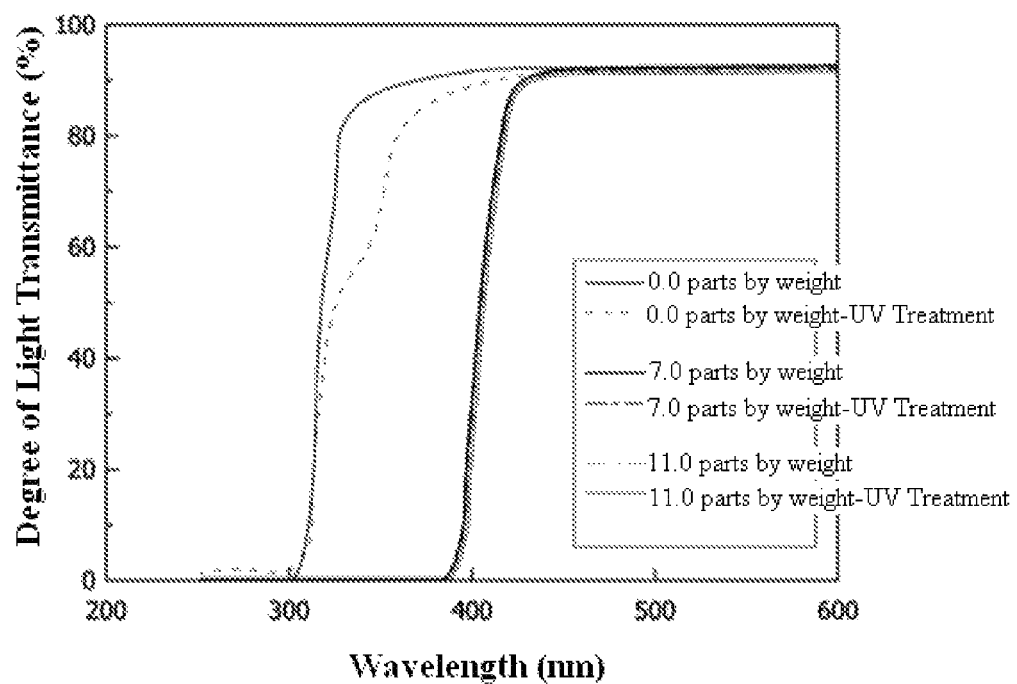
FIG. 8 is a graph showing a degree of light transmittance according to contents of a UV absorbent and a UV stabilizer and a degree of light transmittance according to UV treatment with respect to a pressure-sensitive adhesive layer having the structure of Example 1.

Referring to FIG. 8, a rate of absorbing UV 'A' in a wavelength range of 320 to 400 nm for the protective films to which a UV absorbent was added at 7.0 and 11.0 parts by weight was close to approximately 100%. In addition, referring to FIGS. 7 and 8, an excellent UV barrier effect was shown when a UV absorbent was used in combination with a UV stabilizer, compared with when a UV absorbent was used alone. Accordingly, it was confirmed that the protective film according to the present invention was suitable for protecting solar cells.

A protective film according to the present invention can be used in various ways in organic electronic devices such as solar cells.

A protective film for a solar cell according to the present invention can prevent degradation of efficiency of a solar cell module due to oxygen and moisture penetration, can prevent degradation in performance of a protective film caused by UV rays, and thus can significantly improve efficiency and lifespan of the solar cell module.

What is claimed is:
1. A solar cell, comprising:
  a solar diode having a first surface;
  a first pressure-sensitive adhesive layer;
  a barrier film having a structure comprising:
    a substrate layer having a first surface and a second opposing surface, the substrate layer formed by no more than two separate layers;
    a first organic-inorganic hybrid layer, a first inorganic barrier layer consisting of SiO$_2$, and a second organic-inorganic hybrid layer, which are sequentially presented on one surface of the substrate layer, are stacked;
  a second pressure-sensitive adhesive layer; and
  a fluorine-based polymer layer,
  wherein the solar diode, the first pressure-sensitive adhesive layer, the barrier film, the second pressure-sensitive adhesive layer, and the fluorine-based polymer layer are sequentially stacked, and wherein the first pressure-sensitive adhesive layer is in direct contact with the first surface of the solar diode and in direct contact with the second surface of the substrate layer,
  wherein the first organic-inorganic hybrid and the second organic-inorganic hybrid layer; or the first pressure-sensitive adhesive layer and the second pressure-sensitive adhesive layer, includes at least one of an ultraviolet ray stabilizer and an ultraviolet ray absorbent,
  wherein at least one of the first organic-inorganic hybrid layer and the second organic-inorganic hybrid layer is a partial hydrolysate of a composition including organic silane and metal alkoxide,
  wherein the fluorine-based polymer layer includes: a fluorine-containing copolymer, which is a copolymer of a monomer containing a fluorine atom; and a monomer containing a hydroxyl or epoxy group.

2. The solar cell of claim 1, wherein the substrate layer includes at least one of a homopolymer, a blend of at least two polymers and a polymer composite material containing an organic or inorganic additive.

3. The solar cell of claim 1, wherein the substrate layer is a polymer-clay nanocomposite in which clay nano materials are dispersed in a polymer matrix.

4. The solar cell of claim 1, wherein the partial hydrolysate of the composition comprises:
  20 to 99.99 parts by weight of the organic silane; and
  0.01 to 80 parts by weight of the metal alkoxide,
  based on 100 parts by weight of the composition for manufacturing the organic-inorganic hybrid layer.

5. The solar cell of claim 1, wherein the monomer containing a fluorine atom includes at least one of tetrafluoroethylene, hexafluoropropylene, vinylidene fluoride, chlorotrifluoroethylene, trifluoroethylene, tetrafluoroethylene, alkylvinylether fluoride, alkoxyalkylvinylether fluoride, perfluoro(alkylvinylether), perfluoro(alkoxyvinylether) and fluorine-containing (meth)acrylic acid ester.

6. The solar cell of claim 1, wherein the monomer containing the hydroxyl or epoxy group includes at least one of hydroxyethylvinylether, hydroxypropylvinylether, hydroxybutylvinylether, hydroxypentylvinylether, hydroxyhexylvinylether, hydroxyethylarylether, hydroxybutylarylether, glycerolmonoarylether, allylalcohol and hydroxyethyl (meth)acrylic acid ester.

7. The solar cell of claim 1, wherein the substrate is in the form of a single layer.

* * * * *